(12) United States Patent
Chen

(10) Patent No.: US 7,029,374 B2
(45) Date of Patent: Apr. 18, 2006

(54) METHOD FOR CLEANING SEMICONDUCTOR WAFERS

(75) Inventor: Ga-Lane Chen, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/871,644

(22) Filed: Jun. 18, 2004

(65) Prior Publication Data

US 2004/0255973 A1    Dec. 23, 2004

(30) Foreign Application Priority Data

Jun. 18, 2003    (TW) .................... 92116599 A

(51) Int. Cl.
*B24B 1/00* (2006.01)

(52) U.S. Cl. ............ 451/41; 451/54; 422/186.3; 502/242; 502/227; 134/1.3; 438/678

(58) Field of Classification Search ............ 451/36, 451/41, 54, 63; 15/105; 422/121, 122, 186.3; 502/224, 242, 227; 134/1.2, 1.3; 438/685, 438/678

See application file for complete search history.

(56) References Cited

U.S. PATENT DOCUMENTS

| 6,364,744 B1 | 4/2002 | Merchant et al. |
| 6,435,947 B1 * | 8/2002 | Mueller et al. ............... 451/41 |
| 6,537,381 B1 | 3/2003 | Mikhaylich et al. |
| 6,541,434 B1 | 4/2003 | Wang |
| 6,624,070 B1 * | 9/2003 | Merricks et al. ............ 438/678 |

FOREIGN PATENT DOCUMENTS

JP    411023838    *    1/1999

* cited by examiner

*Primary Examiner*—Eileen P. Morgan
(74) *Attorney, Agent, or Firm*—Wei Te Chung

(57) ABSTRACT

A method for cleaning a surface of semiconductor wafer after chemical mechanical polishing in accordance with the present invention comprises the steps of: (1) providing a semiconductor wafer having a surface to be treated; (2) applying a photocatalyst containing solution to the surface, the solution having a plurality of photocatalyst particles; and (3) applying light to the surface, the light being adapted to activate the photocatalyst particles.

11 Claims, 1 Drawing Sheet

METHOD FOR CLEANING SEMICONDUCTOR WAFERS

BACKGROUND OF THE INVENTION

1. Field of the Invention

The present invention relates to a method for processing a semiconductor wafer, and more particularly to a method for cleaning a surface of a semiconductor wafer after chemical mechanical polishing.

2. Description of Related Art

In the semiconductor processing industry, chemical mechanical polishing (CMP) is known as one of the best techniques for planarizing and polishing a surface of a semiconductor wafer. CMP generally involves a polishing slurry composition which often contains abrasive particles such as silica and alumina in an acidic or basic solution. Typically, an aqueous solution is used to remove the particles and contaminants away from the surface after the CMP is completed. For instance, U.S. Pat. No. 6,537,381 discloses a method for cleaning and treating a semiconductor wafer after CMP. An improved cleaning chemical (ICC) is applied in the method. The ICC solution preferably includes ammonium hydroxide ($NH_4OH$), ethylenediaminetetraacetic acid (EDTA), hydrogen peroxide ($H_2O_2$) and deionized water. The method includes at least four steps, and is complex and inconvenient to implement. It is also expensive since a multitude of devices and chemical reagents must be used.

U.S. Pat. No. 6,364,744, entitled "CMP System and Slurry for Polishing Semiconductor Wafers and Related Method," discloses a method for chemical mechanical polishing a semiconductor wafer including metal. The method includes the steps of: providing relative movements between a semiconductor wafer and a polishing article; providing light to an interface between the polishing article and the semiconductor wafer; and delivering a slurry to the interface between the semiconductor wafer and the polishing article. The slurry preferably includes abrasive particles and at least one photocatalyst which are utilized to enhance oxidation of the metal in the semiconductor wafer.

However, the photocatalyst is only used during the CMP, in order to enhance oxidation of the metal in the semiconductor wafer. A plurality of particles and contaminants remained on the interface after the CMP. Consequently, the semiconductor wafer still needs to undergo cleaning treatment.

SUMMARY OF THE INVENTION

In view of the above-described shortcomings, an object of the present invention is to provide a simple, low cost and highly efficient method for cleaning a surface of a semiconductor wafer.

In order to achieve the object set out above, a method for cleaning a semiconductor wafer in accordance with the present invention comprises the steps of: providing a semiconductor wafer having a surface to be treated; applying a photocatalyst containing solution to the surface, the solutions having a plurality of photocatalyst particles; and applying light to the surface, the light being adapted to activate the photocatalyst particles.

These and other features, aspects and advantages of the invention will become more apparent from the following detailed description, claims, and the accompanying drawings, in which:

DETAILED DESCRIPTION OF THE PRESENT INVENTION

Figure 1:
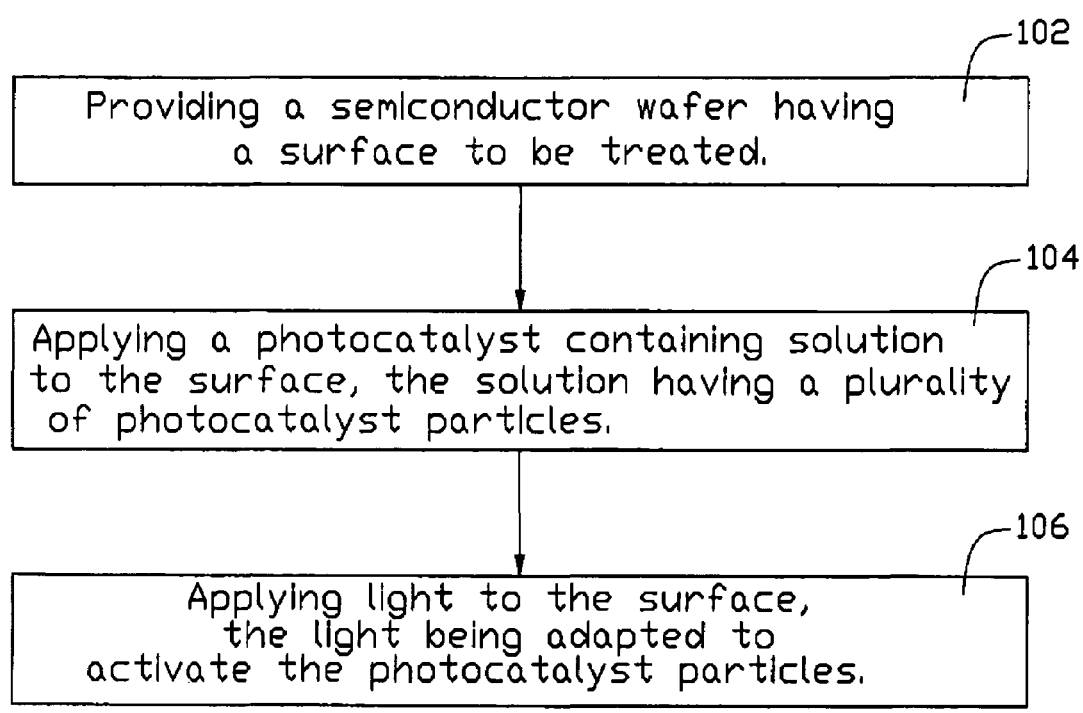
FIG. 1 is a flowchart showing a process for cleaning a surface of a semiconductor wafer by utilizing a photocatalyst containing solution in accordance with a preferred embodiment of the present invention.

Reference will now be made to the drawings to describe the preferred method of the present invention in detail.

Referring to FIG. 1, a method for cleaning a surface of semiconductor wafer after chemical mechanical polishing in accordance with the preferred embodiment of the present invention comprises the steps of: (1) providing a semiconductor wafer having a surface to be treated; (2) applying a photocatalyst containing solution to the surface, the solution having a plurality of photocatalyst particles; and (3) applying light to the surface, the light being adapted to activate the photocatalyst particles.

In step (1), generally designated with 102, a semiconductor wafer having a surface to be treated is provided. The surface has already undergone CMP. After the CMP, contaminants remain on the surface. These contaminants may, for example, include slurry particle remnants, metal ion remnants and organic compound remnants. The contaminants generally have an adverse effect on the performance of the semiconductor wafer, and need to be removed from the surface.

In step (2), generally designated with 104, a photocatalyst containing solution is applied to the surface of the semiconductor wafer. The photocatalyst containing solution includes photocatalyst particles such as titanium oxide ($TiO_2$) and oxides of zinc according to the formula $ZnO_x$, and an aqueous solvent, such as deionized water. Preferably, sizes of the photocatalyst particles are generally in the range from 15 to 50 nanometers. The photocatalyst containing solution is applied to the surface by spraying such that the photocatalyst containing solution is uniformly and thoroughly distributed on the surface.

Alternatively, the semiconductor wafer can be placed into a container, the container having the above-described photocatalyst containing solution therein. The container is preferably a sonicator. The sonicator is for distributing the photocatalyst containing solution uniformly on the surface.

In step (3), generally designated with 106, light is applied to the surface of the semiconductor wafer to activate the photocatalyst particles. Preferably, the light is ultraviolet light having a wavelength less than or equal to 380 nanometers, and an intensity of the ultraviolet light is greater than or equal to 1 $mW/cm^2$. The photocatalyst particles thereby induce reduction-oxidation reactions that decompose the contaminants. Then the contaminants are readily removed from the surface.

It is understood that additional cleaning processes can be used after step (3). Preferably, the surface is rinsed with deionized water in order to completely remove the decomposed contaminants from the surface. The rinsing preferably lasts between about 20 seconds and about 40 seconds.

Operational principles of the present invention will be explained in detail below, using titanium oxide ($TiO_2$) as an example of the photocatalyst particles.

When irradiated by the ultraviolet light having a wavelength less than or equal to 380 nanometers, the particles of titanium oxide react with adjacent molecules of water and oxygen. A plurality of hydrogen ions ($H^+$), hydroxyl ions (OH⁻), and free radicals having strong reductive and oxidative capabilities (such as $O^-$, $O_2^-$, and $O_3^-$) are produced by such reaction. Thus, the contaminants can be decomposed by the free radicals and then removed from the surface. In addition, large water droplets can not be easily formed on the surface, due to the presence of hydrogen ions ($H^+$) and hydroxyl ions ($OH^-$) thereon. A contact angle between any water droplet and the surface is reduced to a value close to zero, which is significantly less than a corresponding contact angle prior to performing the cleaning method of the present invention. That is, the surface is rendered super hydrophilic after the irradiation of ultraviolet light.

While the present invention has been described with reference to particular embodiments, the description is illustrative of the invention and is not to be construed as limiting the invention. Therefore, various modifications can be made to the preferred embodiments by those skilled in the art without departing from the true spirit and scope of the invention as defined by the appended claims.

What is claimed is:

1. A method for cleaning a surface of a semiconductor wafer after chemical mechanical polishing, the method comprising the steps of:
    providing a semiconductor wafer having a surface to be treated;
    applying a photocatalyst containing solution to the surface, the solution having a plurality of photocatalyst particles; and
    applying light to the surface, the light being adapted to activate the photocatalyst particles.

2. The method as recited in claim 1, wherein diameters of the photocatalyst particles are in the range from 15 to 50 nanometers.

3. The method as recited in claim 1, wherein the photocatalyst particles comprise a plurality of particles of at least one of titanium oxide ($TiO_2$) and oxides of zinc.

4. The method as recited in claim 1, wherein the light comprises ultraviolet light.

5. The method as recited in claim 4, wherein a wavelength of the ultraviolet light is less than or equal to 380 nanometers.

6. The method as recited in claim 4, wherein an intensity of the ultraviolet light is greater than or equal to 1 $mW/cm^2$.

7. The method as recited in claim 1, wherein the photocatalyst containing solution is applied to the surface by spraying.

8. The method as recited in claim 1, wherein the photocatalyst containing solution is applied to the surface by placing the semiconductor wafer into a container, the container having the photocatalyst containing solution therein.

9. The method as recited in claim 8, wherein the container comprises a sonicator.

10. A method for cleaning a surface of a semi-finished electronic component after chemical mechanical polishing, the method comprising the steps of;
    providing said semi-finished electronic component having a surface to be treated;
    applying a catalyst containing solution to the surface, the solution having a plurality of catalyst particles; and
    applying a non-chemical factor to the surface to activate the catalyst particles.

11. A method for cleaning a surface of a semi-finished electronic component after chemical mechanical polishing, the method comprising the steps of:
    providing said semi-finished electronic component having a surface to be treated;
    placing the electronic component into a solution containing catalyst particles, the solution being in a sonicator; and
    applying a non-chemical factor to the surface to activate the catalyst particles.

* * * * *